United States Patent
Okubo

(10) Patent No.: US 7,893,453 B2
(45) Date of Patent: Feb. 22, 2011

(54) LED DEVICE AND METHOD FOR MANUFACTURING THE SAME

(75) Inventor: Tsutomu Okubo, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 10 days.

(21) Appl. No.: 12/326,567

(22) Filed: Dec. 2, 2008

(65) Prior Publication Data

US 2009/0146171 A1    Jun. 11, 2009

(30) Foreign Application Priority Data

Dec. 5, 2007    (JP) .............................. 2007-314603

(51) Int. Cl.
*H01L 33/00*    (2010.01)

(52) U.S. Cl. ............... 257/100; 257/787; 257/E31.117; 257/E51.02

(58) Field of Classification Search ............. 257/79, 257/82, 95, 98, 99, 100, 787, 790, 791, E31.117, 257/E31.119, E51.02, E23.116, E23.124, 257/E23.126, E23.128, E23.134

See application file for complete search history.

(56) References Cited

U.S. PATENT DOCUMENTS

2002/0093287 A1*  7/2002  Chen ........................ 313/512
2003/0178632 A1*  9/2003  Hohn et al. ................ 257/99
2007/0012940 A1*  1/2007  Suh et al. .................. 257/99

FOREIGN PATENT DOCUMENTS

| JP | 2006143861 | 6/2006 |
| JP | 2007036030 | 2/2007 |

* cited by examiner

*Primary Examiner*—Davienne Monbleau
*Assistant Examiner*—Dilinh P Nguyen
(74) *Attorney, Agent, or Firm*—Kenealy Vaidya LLP

(57) ABSTRACT

A semiconductor light-emitting device and a method for manufacturing the same can include a soft silicon resin encapsulating an LED chip with a thin overcoat of microparticles located on the silicon resin to prevent dirt and dust from attaching to the silicon resin. The semiconductor light-emitting device can include a base board having at least one LED chip, a reflector fixed on the base board so as to enclose the LED chip, a soft silicon resin having a tacky surface disposed in the reflector, and an overcoat of microparticles on the silicon resin. Thus, manufacturing lead time can be reduced because the microparticles can attach to the silicon resin in a thin and single layer and a solidifying process for an extra layer on top of the silicon resin is not necessary. The overcoat of microparticles can prevent dirt and dust from attaching to the silicon resin, and can decrease optical variability in an inclined direction from an optical axis of the device.

24 Claims, 6 Drawing Sheets

LED DEVICE AND METHOD FOR MANUFACTURING THE SAME

This application claims the priority benefit under 35 U.S.C. §119 of Japanese Patent Application No. 2007-314603 filed on Dec. 5, 2007, which is hereby incorporated in its entirety by reference.

BACKGROUND

1. Field

The presently disclosed subject matter relates to semiconductor light-emitting devices including an LED chip and to a manufacturing method for the same, and more particularly to reliable semiconductor light-emitting devices including a silicon resin for encapsulating the LED chip and to the manufacturing method for these devices.

2. Description of the Related Art

Various semiconductor light-emitting devices including an LED chip have been used for general lighting in recent years. One reason is that an LED chip may be a favorable light source with respect to energy savings and environmental concerns. In addition, semiconductor light-emitting devices including an LED chip can emit variously-colored light while the structure thereof can be thin and small in size. High power LED chips have been developed and have been used as a light source in keeping the above trend.

However, while high power LED chips have been used as a light source for light-emitting devices, an epoxy resin that has been generally used as an encapsulating resin for LEDs has become difficult to use for semiconductor light-emitting devices, especially for devices that require high reliability. This is sometimes due to stress caused by a difference of thermal expansion coefficients between the material for mounting the LED chip and the encapsulating resin that is composed of epoxy. In some cases, a semiconductor light-emitting device that includes the epoxy resin may be damaged by the above-referenced stress. In addition, an epoxy resin may deteriorate in terms of quality and function thereof due to ultraviolet rays emitted from an LED chip, especially from the high power LED chip that can emit a light of high intensity.

Thus, while high-power LED chips become more prevalently used as a light source for a semiconductor light-emitting device, a soft silicon resin has been more frequently employed as an encapsulating resin in these devices. A characteristic of the soft silicon resin is that it may not be damaged by the above-described stress and may not deteriorate in quality due to ultraviolet rays. A soft silicon resin can generally resolve or reduce the problems caused by the ultraviolet rays and the stress. However, certain other problems or concerns are present when using a soft silicon resin, such as the characteristic that dirt and dust may easily attach to a surface thereof during the manufacturing process for the light-emitting device. Dirt and dust and other debris are attracted to the silicon resin because the surface thereof might be tacky.

A conventional light-emitting device that may resolve the above-described problems, for example, is disclosed in Patent Document No. 1 (Japanese Patent Application Laid Open JP2007-036030). According to Patent Document No. 1, and as shown in FIG. 6, a pair of lead frames 23a, 23b is insert-formed in a casing 21 that includes a cavity 22 for encapsulating an LED chip 24 with encapsulating resins described later. The pair of lead frames 23a, 23b is depicted on a bottom surface of the cavity 22.

The LED chip 24 is mounted on the lead frame 23a via a conductive material and has one electrode thereof that is electrically connected to the lead frame 23a via one bonding wire 25a. The other electrode of the LED chip 24 is electrically connected to the lead frame 23b via the other bonding wire 25b. A first silicon resin 26a including a phosphor 28 is disposed in the cavity 22 so as to encapsulate the LED chip 24.

The phosphor 28 can absorb light emitted from the LED chip 24 and can convert the light into a different wavelength of light as compared to that of the light emitted directly from the LED chip 24. Therefore, the light-emitting device including the LED chip 24 may emit variously-colored light according to the type, quality, kind, etc., of phosphor 28 located within the resin 26a. The first silicon resin 26a including the phosphor 28 may also protect the LED chip 24 from problems caused by dust, moisture, etc.

In this case, dirt and dust may attach to a surface of the first silicon resin 26a. Accordingly, the surface of the first silicon resin 26a is covered by a second silicon resin 26b that is configured with a hard silicon resin having a higher hardness as compared to the first silicon resin 26a. Thus, the second silicon resin 26b having a high hardness can prevent dirt and dust from attaching to a surface thereof, and therefore the light-emitting device can operate reliably and maintain predetermined optical characteristics.

However, the above-described light-emitting device requires a process for covering the surface of the first silicon resin 26a with the second silicon resin 26b during manufacture. In addition, the light-emitting device requires both a process for at least partly solidifying the first silicon resin 26a before covering it with the second silicon resin 26b and a process for solidifying the second silicon resin 26b. Thus, a manufacturing method for the light-emitting device may include certain problems or concerns, such as increased lead time for manufacturing the device as compared to that for manufacturing a conventional light-emitting device.

In addition, the second silicon resin 26b may be difficult to form in a thin and uniform layer in a short time with a simple manufacturing machine. Thus, the light-emitting device may be difficult to form in a thin manner while accomplishing predetermined optical characteristics in line with the trend of providing thinner devices. The conventional device may also include variability in terms of optical characteristics from product to product if a thickness of the second silicon resin 26b cannot be made uniform in the overcoat and solidifying processes.

On the other hand, an inventor of the disclosed subject matter discovered that a microparticle such as silicon dioxide and the like can be useful as a luminescent material as disclosed in Patent Document No. 2 (Japanese Patent Application Laid Open JP2006-143861). A manufacturing method for the microparticle is also disclosed in detail in Patent Document No. 2.

The above-referenced Patent Documents are listed below, and are hereby incorporated with their English abstracts in their entireties.

1. Patent Document No. 1: Japanese Patent Application Laid Open JP2007-036030
2. Patent Document No. 2: Japanese Patent Application Laid Open JP2006-143861

The disclosed subject matter has been devised to consider the above and other problems, features, and characteristics. Thus, embodiments of the disclosed subject matter can include semiconductor light-emitting devices and associated manufacturing methods that do not cause and/or are designed to prevent some of the above-described problems, concerns, and characteristics related to a thin and uniform overcoat and the manufacturing lead time, etc. The disclosed subject matter can also include a light-emitting device that is configured to decrease optical variability caused by differences between a light-emitting color emitted from the optical axis thereof and a light-emitting color emitted in an inclined direction from the optical axis, and can reduce or change other associated problems, features, and characteristics of the conventional devices and methods.

SUMMARY

The presently disclosed subject matter has been devised in view of the above and other problems, features, and characteristics. Another aspect of the disclosed subject matter includes methods of manufacture that provide various semiconductor light-emitting devices including a thin and single layer overcoat and which can provide less lead time while using a simple manufacture machine with respect to conventional light-emitting devices and processes.

According to an aspect of the disclosed subject matter, a semiconductor light-emitting device can include: a base board having at least one pair of electrodes that is connected to electrode conductor patterns for receiving a power supply; at least one LED chip mounted on the at least one pair of electrodes, and also being electrically connected; a reflector being formed in a substantially tubular shape, and fixed on the base board so as to enclose the at least one LED chip; a soft silicon resin having a tacky surface disposed in the reflector; and microparticles configured to be disposed on substantially all the surface of silicon resin opposite the base board so as not to expose the silicon resin to the outside.

As a variation of the above-described exemplary semiconductor light-emitting device, the reflector can be eliminated. The semiconductor light-emitting device can include: the base board; the at least one LED chip; the silicon resin disposed on the pair of electrodes so as to encapsulate the at least one LED chip and bonding wire(s); and microparticles configured to be disposed in a dome-shape on substantially all the surface of silicon resin that does not face the base board so as not to expose the silicon resin to the outside.

In the above-described exemplary semiconductor light-emitting device, the silicon resin can include at least one of a diffuser, a phosphor material, colored particles using a dye, and a pigment, wherein the phosphor material, colored particles using a dye, and pigment are configured to selectively absorb light having a predetermined wavelength. The microparticles can be configured with $SiO_2$, and also can include at least one of a particle of pigment, a particle of phosphor material and a colored particle using a dye.

According to the above-described exemplary semiconductor light-emitting device, the device can reduce a decrease of light intensity caused by dirt and dust attached on the light-emission surface thereof because the silicon resin can be prevented from accumulating dirt and dust thereon with the overcoat of microparticles. In addition, because the microparticles can accelerate mixing the light emitted from the LED chip with wavelength-converted light via the phosphor material, the device can reduce an optical variability that can otherwise be caused by differences between a light-emitting color emitted from an optical axis thereof and a light-emitting color emitted in an inclined direction from the optical axis.

Another aspect of the disclosed subject matter includes a method for manufacturing the above-described semiconductor light-emitting devices that can include: preparing a base board that includes at least one pair of electrodes, whereon at least one LED chip is electrically connected; encapsulating the at least one LED chip with a silicon resin having an tacky surface; solidifying the silicon resin; and spraying microparticles on substantially all surface of the silicon resin that does not expose to the outside.

In the above-described exemplary method for manufacturing the semiconductor light-emitting devices, the same or similar variations of the device can be employed as set forth above.

According to the above-described exemplary method for manufacturing semiconductor light-emitting devices, lead time can be reduced with respect to a conventional manufacturing method because the microparticles are not required to undergo a solidifying process. Furthermore, because the microparticles can attach to the silicon resin in a thin and single layer by spraying them on the tacky surface of the silicon resin, the overcoat can be formed in a short time with a simple manufacturing machine even if the overcoat is not a flat surface.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
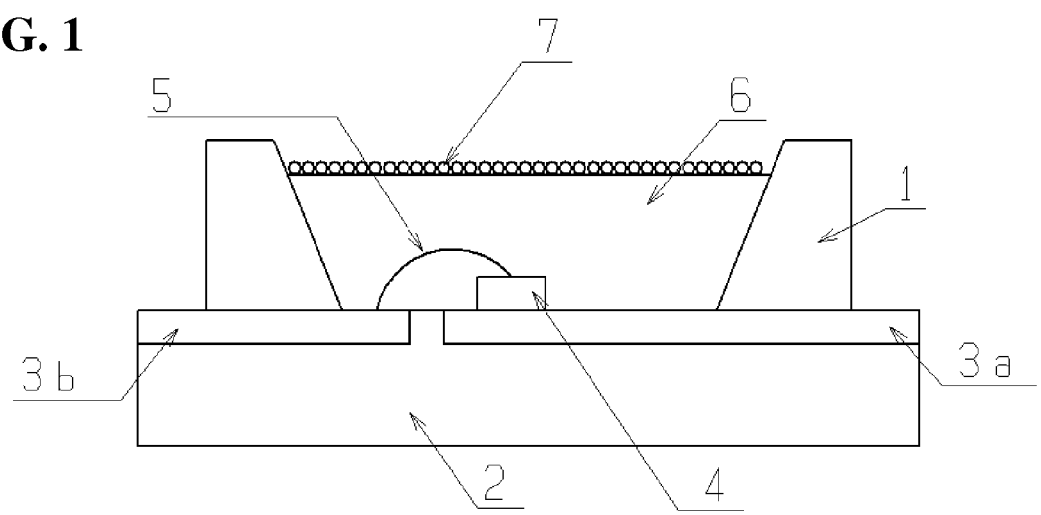
FIG. 1 is a cross-sectional summary view showing a structure for a first exemplary embodiment of a semiconductor light-emitting device made in accordance with principles of the disclosed subject matter.

The first exemplary embodiment of the disclosed subject matter will now be described in detail with reference to FIG. 1. FIG. 1 is a cross-sectional summary view of a first exemplary embodiment made in accordance with principles of the disclosed subject matter.

The semiconductor light-emitting device can include: a base board 2 having a pair of electrodes 3a, 3b exposed thereon; an LED chip 4 that is mounted on one electrode 3a of the pair of electrodes via a conductive material. The LED chip can include a top and a bottom electrode connected to a respective one of the pair of electrodes 3a, 3b via the conductive material and a bonding wire 5, respectively. A reflector 1 can be formed in a substantially tubular shape with a cavity, and disposed on the base board so as to enclose the LED chip 4. A silicon resin 6 can be disposed in the cavity formed by the reflector 1 and the base board 2.

In this embodiment, the silicon resin 6 can be configured as a soft silicon resin having a tacky surface, and microparticles 7 such as $SiO_2$ and the like can be attached to substantially the entire surface of silicon resin opposite the base board 2 so as not to expose the silicon resin 6 to the outside. Thus, the light-emitting device can prevent dirt and dust from attaching to a light-emission surface thereof that is composed of the microparticle 7 formed on the silicon resin 6. Each of the above-described components will now be described in detail.

The base board 2 can be made using high temperature conductive materials, such as a metal board that is provided with Au, Al, and the like with an insulating layer thereon or a ceramic substrate, such as $Al_2O_3$, AlN, SiC, $Si_3N_4$ and $ZrO_2$. The base board 2 can be formed with the pair of electrodes 3a, 3b on a surface thereof, and the pair of electrodes 3a, 3b can be connected to electrode conductor patterns for receiving a power supply.

The reflector 1 can be composed of an opaque resin material, metal material, ceramic material and the like, and can be fixed at a predetermined position on the base board 2 via an adhesive material with a high temperature conductivity, or the like. The reflector 1 can define the cavity for exposing the pair of electrodes 3a, 3b and can be configured for reflecting the light of an LED chip 4. Thus, the reflector 1 can be made using high reflectivity materials for the LED chip 4. Alternatively, an inner surface of the reflector 1 can be coated with a material with high reflectivity.

The reflector 1 can also be integrated with the base board 2 as one body. In the case when they are formed as one body, the base board 2 including the reflector 1 can be insert-formed with the pair of electrodes 3a, 3b using lead frames.

The LED chip 4 can include, for example, a blue LED chip composed of a GaN-based compound semiconductor, a red LED chip composed of GaAs-based compound semiconductor and the like for any purpose or specific application. The LED chip 4 can be mounted on the pair of electrodes 3a, 3b of the base board 2 in the cavity of the reflector 1. The pair of electrodes 3a, 3b can be electrically connected to both electrodes of the LED chip 4 via die bonding and wire bonding, respectively.

When the LED chip 4 is mounted on one electrode 3a of the pair of electrodes via die bonding, a solder, a silver paste and the like can be used as an adhesive material that is electrically conductive. When an electrode of the LED chip 4 is electrically connected to the other electrode 3b of the pair of electrodes via wire bonding, an Au wire and the like can be used as a conductive wire 5. The LED chip 4 is not limited to one chip, and can also include a plurality of chips. Additionally, the LED chip can be mounted on the pair of electrodes via a sub mount.

The silicon resin 6 can be configured as a soft silicon resin having a tacky surface. The soft silicon resin can be an elastomeric resin and a gelled resin that have hardness within the range of substantially 30 to 80 in shore hardness A. A thermosetting silicon resin can also be used as the silicon resin 6. The silicon resin 6 can include a diffuser such as $TiO_2$, $CaCO_3$ and the like for efficiently emitting light to the outside.

Thus, the silicon resin 6 does not deteriorate very much in quality and function due to ultraviolet rays in the light emitted from the LED chip 4, and can efficiently emit the light emitted from the LED chip 4 to the outside therethrough. In addition, the light-emitting device is configured to prevent damage due to stress caused by a difference of thermal expansion coefficients between the silicon resin 6 and the above-described materials for mounting the LED chip 4 because the silicon resin 6 can be configured as a soft silicon resin that can absorb the stress.

The microparticles 7 can be configured in various shapes and can include various materials such as phosphors. The microparticles 7 can be sized within a range of substantially 1 to 20 micrometer in mean particle size. In this case, because the microparticles 7 can be dispersed in a volatile solution and can be sprayed on the soft silicon resin, or because the microparticle 7 can be directly splayed by air on the soft silicon resin, the overcoat process of the microparticles 7 can be easier than a conventional process such as when the soft silicon resin is covered with a harder silicon resin, and also can be carried out by a simple manufacturing machine even if a surface of the silicon resin 6 is not flat.

In addition, the thickness of the overcoat formed on the silicon resin 6 can become thinner by using microparticles 7 that have a mean particle size of less than 10 micrometer. The microparticles 7 can include different materials, such as $SiO_2$, $Al_2O_3$, $B_2O_3$, MgO, CaO, ZnO, AlN, $TiO_2$, acrylic, polycarbonate and the like. For example, $SiO_2$ can be a favorable material in certain application and can maintain a strong attachment to the silicon resin 6 while also being a clear material having high transparence.

Furthermore, the microparticles 7 are not necessarily transparent, and can be composed of a colored material such as red, green and the like, that is, a pigment, a colored microparticle using a dye and a phosphor for selectively absorbing light emitted from the LED chip 4 and emitting a different colored light from that of the LED chip 4. When both the above-described colored microparticle and a mixture microparticle mixed with a transparent material with a colored material can be used as the microparticles 7, the microparticles 7 can provide a color correction for a colored light of the light-emitting device.

The microparticles 7 can attach to substantially the entire surface of silicon resin opposite the base board 2 so as not to expose the silicon resin 6 to the outside. The overcoat layer formed on the soft silicon resin is not necessarily a plurality of layers. For example, a single layer of microparticles can be formed on the soft silicon resin. Thus, because the thickness of the overcoat layer can be substantially the same thickness as the particle size of the microparticle, the overcoat layer can be formed as a thin single layer.

The reason that the microparticles 7 can attach to the soft silicon resin which has a tacky surface, but do not attach to each other is because the microparticles 7 can be formed of an incohesive material. Therefore, even when the microparticles may accumulate on the surface of the soft resin 6, the single layer can be easily formed by blowing the excess microparticles 7 away with an air gun, etc.

Figure 2:
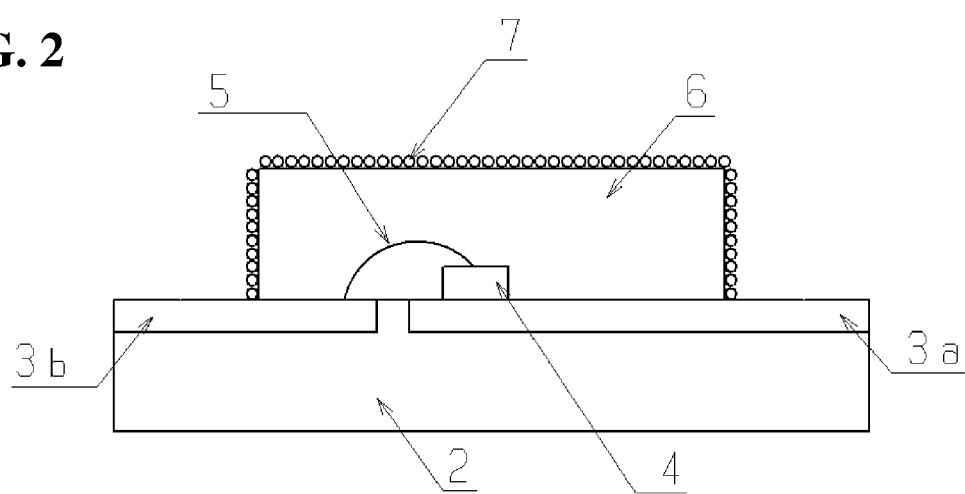
FIG. 2 is a cross-sectional summary view showing a structure for a second exemplary embodiment of a semiconductor light-emitting device made in accordance with principles of the disclosed subject matter.

A second exemplary embodiment of the disclosed subject matter will now be described with reference to FIG. 2. A semiconductor light-emitting device of the second exemplary embodiment is shown in FIG. 2, wherein the same or similar elements shown in FIG. 1 are referenced by same reference numerals. The light-emitting device can be similar to the light-emitting device shown in FIG. 1. A difference between the semiconductor light-emitting devices of FIG. 1 and FIG. 2 can be the absence of a reflector structure in the embodiment shown in FIG. 2.

In the second exemplary embodiment, a circuit board that is generally used for a surface mount device can also be used as the base board 2 similar to the first exemplary embodiment. When the silicon resin 6 is disposed on the base board 2, the soft silicon resin can be directly disposed by a dispenser so as to encapsulate the LED chip 4 mounted on the pair of electrode 3a, 3b.

In this case, the shape of the silicon resin 6 can be formed using the variables of quantity, hardness and surface tension of the soft silicon resin to obtain a desired form. Therefore, because the process may be simple and can be carried out in a short time by a simple manufacturing machine, the process may be useful for use in manufacturing the above-described surface mount LED devices that are thin and small and are produced at low cost. However, the method may make it difficult to exactly form a same and consistent shape in many products.

When it is desired that the silicon resin 6 form a same and consistent shape in many products, a molding tool can be placed on the base board 2 and used to accurately and consistently dispose and shape the silicon resin 6. When the silicon resin 6 is disposed in the cavity formed by the molding tool and the molding tool is removed after the silicon resin 6 is solidified, the silicon resin 6 can be formed in an exactly same shape consistently for many products in accordance with the cavity of the molding tool.

After the silicon resin 6 is formed, the above-described microparticles 7 can be splayed on the soft silicon resin or the soft silicon resin on the base board 2 can dipped into a bath of microparticles 7. Thus, a single layer of microparticles 7 can be formed in a dome-shape on the entire surface of soft silicon resin 6 that does not face the base board 2 so as not to expose the silicon resin 6 to the outside. The microparticles 7 can also be softly blown with an air gun or the like, such that the overcoat layer can be perfectly formed in a thin single layer because excess microparticles 7 can be removed. Thus, the light-emitting device of the second exemplary embodiment can emit a wide range of light on the base board 2.

Figure 3:
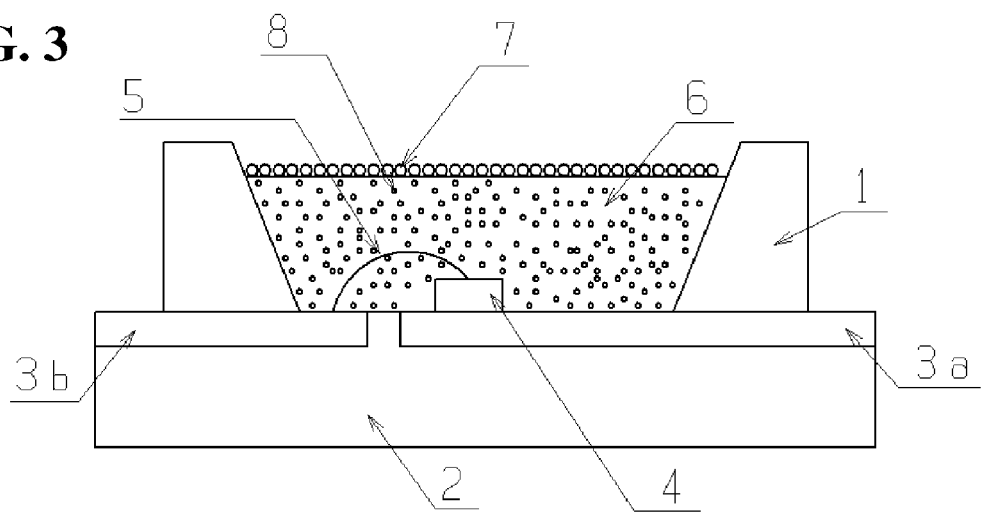
FIG. 3 is a cross-sectional summary view showing another structure for the semiconductor light-emitting device shown in FIG. 1.
Figure 4:
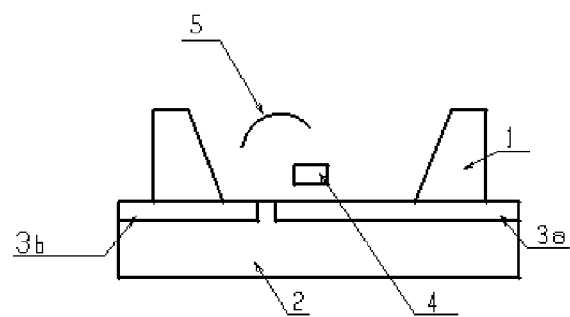
FIG. 4 is a cross-sectional summary view depicting a manufacturing method for a semiconductor light-emitting device in accordance with principles of the disclosed subject matter.
Figure 4:
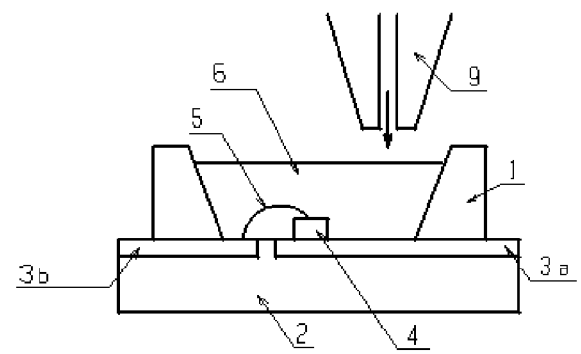
Figure 4:
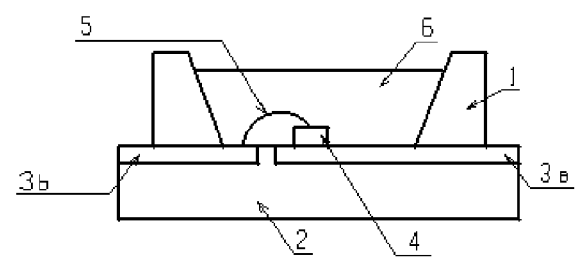
Figure 4:
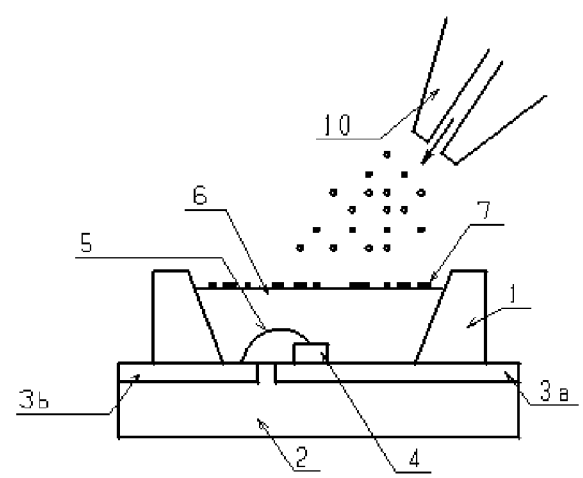

Another exemplary embodiment of the disclosed subject matter will now be described with reference to FIG. 3. FIG. 3 shows a semiconductor light-emitting device that can be configured similar to the semiconductor light-emitting device shown in FIG. 1. Thus, the same or similar elements in FIG. 3 are referenced using the same reference numerals as those in FIG. 1. A difference between the semiconductor light-emitting devices of FIG. 1 and FIG. 3 can be the inclusion of a phosphor 8 in the device shown in FIG. 3.

The phosphor 8 can absorb a predetermined wavelength of light emitted from the LED chip 4, and can emit a different wavelength of light from that emitted from the LED chip 4. For example, when the LED chip is a blue LED chip that emits a blue light with a peak wavelength of 450 nm, YAG: Ce, (Ca, Sr, Ba)$_2$SiO$_4$: Eu, and the like can be used as the phosphor 8.

The phosphor 8 can be mixed with the silicon resin 6, and the silicon resin 6 can be disposed along with the phosphor 8 in the cavity of the reflector 1. When the LED chip 4 is provided with a power supply via the pair of electrodes 3a, 3b, the light-emitting device can emit a mixture light that includes light emitted from the LED chip 3 mixed with wavelength-converted light emitted via the phosphor 8. Alternatively, the light-emitting device can be configured to emit only the wavelength-converted light using the LED chip 4 and the phosphor 8. The silicon resin 6 can also include a pigment that can absorb light having a predetermined wavelength.

The above-described structure can include an overcoat of microparticles 7 on the silicon resin 6 as described in the first and second exemplary embodiments. Therefore, the light-emitting device can also prevent dirt and dust from attaching to the light-emission surface thereof. In addition, the microparticles 7 can accelerate the mixture of light emitted from the LED chip 4 with light that is wavelength-converted light emitted via the phosphor 8.

As described above, conventional light-emitting devices including both an LED chip and a phosphor may exhibit a problem or feature such as optical variability that is caused by a difference between light-emitting color of light emitted from the optical axis thereof and light-emitting color of light emitted in an inclined direction from the optical axis. However, the microparticles 7 can reduce the optical variability because the microparticles 7 can accelerate mixing of light emitted from the LED chip 4 with wavelength-converted light emitted via the phosphor material 8.

A manufacturing method for the above-described semiconductor devices will now be described in detail with reference to FIGS. 4A-D. The same or similar elements in FIGS. 4A-D are used to reference the same or similar features as shown in FIGS. 1-3.

In process A shown in FIG. 4(A), an exemplary method for manufacturing semiconductor light-emitting devices can include: preparing or providing a base board 2 that includes at least one pair of electrodes 3a, 3b, whereon at least one LED chip 4 is mounted and is electrically connected; fixing a reflector 1 to the base board, the reflector being formed in a substantially tubular shape with a cavity so as to enclose the at least one LED chip 4 therein. In this case, the LED chip 4 can be electrically connected using a flip chip via die bonding and wire bonding.

In process B shown in FIG. 4(B), the method can include filling a silicon resin 6 in the cavity using a dispenser 9 so as to enclose the at least one LED chip 4 mounted on the at least one pair of electrodes 3a, 3b of the base board 2.

In process C shown in FIG. 4(C), the method can include solidifying the silicon resin 6. In this case, for instance, the silicon resin 6 can be solidified for four hours at 150 degrees centigrade. However, it should be noted that the surface of the silicon resin 6 can be solidified either before process D (described below), and/or the silicon resin 6 can be absolutely solidified after process D.

In process D shown in FIG. 4(D), the method can include spraying the microparticles 7 on the silicon resin 6 using a sprayer 10. In this case, the microparticles 7 are dispersed in a volatile solution and can be sprayed on the silicon resin 6. Moreover, the microparticles 7 can be directly sprayed by the sprayer 10 onto the resin 6. If excess microparticles 7 are attached to or stacked on the silicon resin 6, the overcoat layer can be formed as a thin and single layer by blowing the microparticles 7 with an air gun and/or the like.

According to the above-described manufacturing method, a hard silicon resin is not required to be disposed on the surface of silicon resin 6. Therefore, both resins can be solidified at the same or different times with respect to each other. Thus, the manufacturing method can provide various semiconductor light-emitting devices in less lead time with respect to a conventional device. Furthermore, the method can form a thin and single overcoat layer on the silicon resin 6 in a short time and with a simple manufacturing machine even if the surface of the silicon resin 6 is not flat.

Results of an exemplary experiment using a semiconductor light-emitting device made in accordance with principles of the disclosed subject matter as compared to a comparative device are described as follows.

COMPARATIVE EXAMPLE

A comparative example device includes: a base board 2 comprising a glass epoxy board; a reflector 1 configured of a resin; a blue LED chip 4 having a dominant wavelength of 455-460 nm mounted on a pair of electrodes and electrically connected to a power source; and a soft silicon resin 6 having 45 in shore hardness A disposed in a cavity of the reflector 1.

Embodiment

An embodiment device further includes microparticles 7 of SiO$_2$ having a mean particle size of 4 to 8 micrometer and located on the soft silicon resin 6 of the comparative example. In this case, the microparticles 7 extend on substantially the entire surface of the silicon resin 6 by application of a brush, and excess microparticles 7 are blown off with an air gun.

Results of a sticking test will now be given with respect to the embodiment and the comparative example. When a plastic sheet is pressed to the comparative example, the plastic sheet easily attaches to the silicon resin 6 of the comparative example. However, the plastic sheet does not attach to the surface of the embodiment device when the plastic sheet is pressed to the embodiment.

Results of light intensity measurements can be described as follows. When a light intensity of the comparative example device is based on 100, a light intensity of the embodiment device is 96. Thus, the microparticles 7 of the embodiment device do not practically affect the light intensity of the embodiment light-emitting device.

Figure 5A:
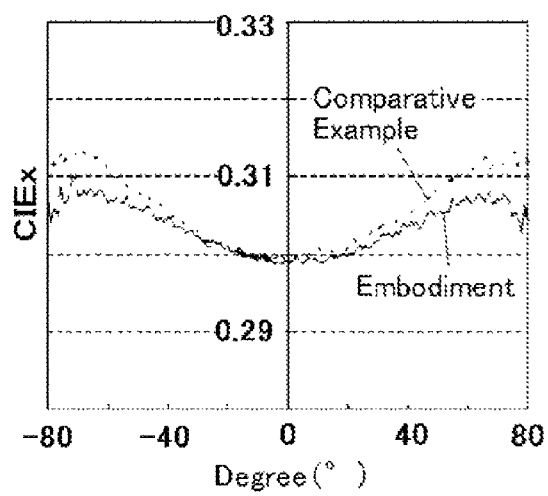
FIGS. 5A and B are diagrams showing a difference between an embodiment of the disclosed subject matter and a comparative example of a conventional semiconductor light-emitting device with respect to each coordinate of an xy chromaticity diagram.
Figure 5:
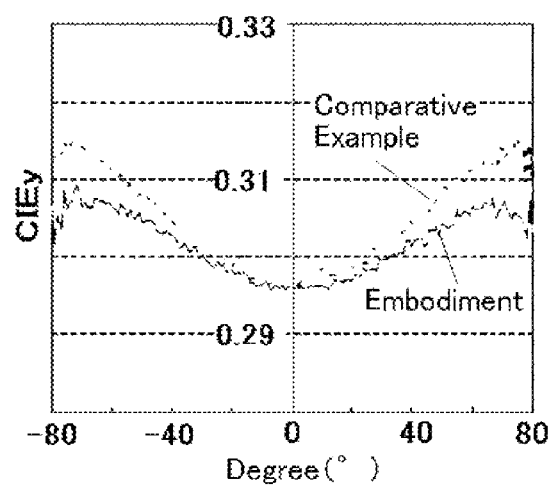
Figure 6:
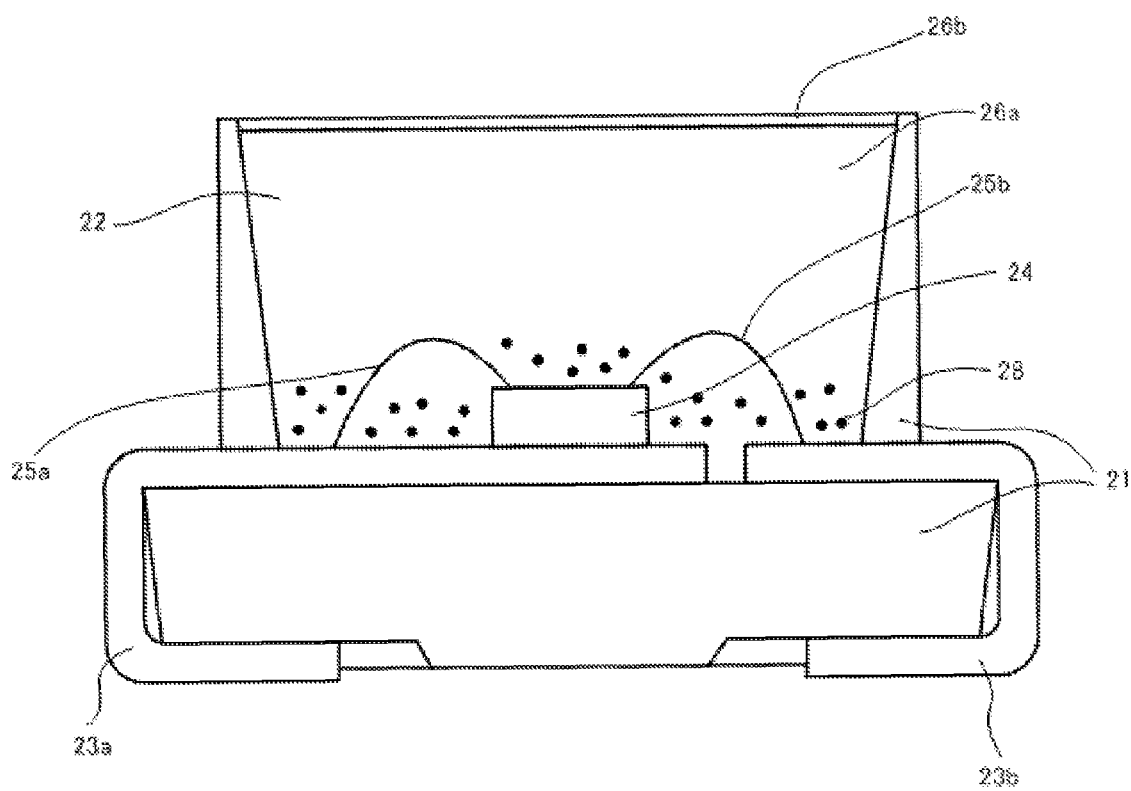
FIG. 6 is a cross-sectional summary view depicting a structure for a conventional semiconductor light-emitting device.

Results of directional characteristics with respect to chromaticity using a goniometer will now be described with reference to FIGS. 5A-B. The vertical axis shown in FIG. 5(A) shows the x-axis in a CIE xy chromaticity diagram, and the vertical axis shown in FIG. 5(B) shows the y-axis in the CIE xy chromaticity diagram. The horizontal axes shown in FIGS. 5(A) and (B) show an inclined angle based on an optical axis (0 degree) of the semiconductor light-emitting device. For example, the optical axis for the devices shown in FIGS. 1-4D and 6 is a vertical line extending from a center of each of the LED chips (4, 24).

For instance, when the horizontal axes are 40 degrees, each of the vertical axes show chromaticity of light emitted in the inclined direction of 40 degrees from the optical axis of the device. The embodiment device exhibits smaller chromaticity variation than that of the comparative example. Thus, the disclosed subject matter can decrease optical variability that is caused between a difference in light-emitting color emitted from the optical axis and light-emitting color emitted in an inclined direction from the optical axis.

In addition, when the semiconductor light-emitting device is mounted on a circuit board at a peak temperature of 260 degrees centigrade in a reflow soldering process, the microparticles 7 and the silicon resin 6 prevent problems such as peeling and the like.

Thus, the disclosed subject matter can provide a semiconductor light-emitting device with high reliability that can reduce the optical variability caused between a difference in light-emitting color emitted from the optical axis thereof and light emitting color emitted in an inclined direction from the optical axis. In addition, a method for manufacturing a semiconductor light-emitting device in accordance with principles of the disclosed subject matter can reduce lead time with respect to that of a conventional manufacturing method because the microparticles 7 do not require a process for solidification.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A semiconductor light-emitting device comprising:
    a base board having at least one pair of electrodes configured to receive a power supply;
    at least one LED chip located adjacent the at least one pair of electrodes of the base board and including LED chip electrodes, and each of the LED chip electrodes being electrically connected to a respective electrode of the at least one pair of electrodes of the base board;
    a reflector including a cavity, the reflector being located adjacent the base board so as to enclose the at least one LED chip;
    a silicon resin configured with a soft silicon resin having a tacky surface to encapsulate the at least one LED chip, the silicon resin being disposed in the cavity of the reflector and having an opposed surface opposed to base board; and
    microparticles disposed on substantially the entire opposed surface of the silicon resin using the tacky surface of the silicon resin and disposed between and in contact with both the silicon resin and an outside atmosphere so as not to expose the silicon resin to the outside atmosphere.

2. The semiconductor light-emitting device according to claim 1, wherein the silicon resin includes at least one of a diffuser, a phosphor material, colored particles using a dye, and a pigment, and wherein the at least one of the phosphor material, colored particles using a dye, and pigment are configured to selectively absorb light having a predetermined wavelength.

3. The semiconductor light-emitting device according to claim 2, wherein the microparticles include SiO$_2$.

4. The semiconductor light-emitting device according to claim 2, wherein the microparticles include at least one of a particle of pigment, a particle of phosphor material, and a colored particle using a dye.

5. The semiconductor light-emitting device according to claim 1, wherein the microparticles include SiO$_2$.

6. The semiconductor light-emitting device according to claim 5, wherein the microparticles include at least one of a particle of pigment, a particle of phosphor material, and a colored particle using a dye.

7. The semiconductor light-emitting device according to claim 1, wherein the microparticles include at least one of a particle of pigment, a particle of phosphor material, and a colored particle using a dye.

8. A method for manufacturing the semiconductor light-emitting device according to claim 1 comprising:
    providing the base board that includes at least one pair of electrodes and at least one LED chip electrically connected to the at least one pair of electrodes;
    encapsulating the at least one LED chip with a silicon resin having a tacky surface exposed to an outside atmosphere;
    solidifying the silicon resin; and
    placing microparticles on substantially the entire tacky surface of the silicon resin such that the tacky surface of the silicon resin is not exposed to the outside atmosphere.

9. The method for manufacturing a semiconductor light-emitting device according to claim 8, wherein the silicon resin includes at least one of a diffuser, a phosphor material, and a pigment configured to selectively absorb light having a predetermined wavelength.

10. The method for manufacturing a semiconductor light-emitting device according to claim 9, wherein the microparticles include at least one of a particle of pigment, a particle of phosphor material, and a colored particle using a dye.

11. The method for manufacturing a semiconductor light-emitting device according to claim 8, wherein the microparticles include at least one of a particle of pigment, a particle of phosphor material, and a colored particle using a dye.

12. The method for manufacturing a semiconductor light-emitting device according to claim 8, wherein placing microparticles includes spraying microparticles onto the tacky surface of the silicon resin.

13. The method for manufacturing a semiconductor light-emitting device according to claim 8, wherein the microparticles include $SiO_2$.

14. The semiconductor light-emitting device according to claim 1, wherein the microparticles, reflector, base board, and base board electrodes encapsulate the entire silicon resin such that no surface of the silicon resin is exposed to outside atmosphere.

15. The semiconductor light-emitting device according to claim 1, wherein the reflector is formed in a substantially tubular shape.

16. A semiconductor light-emitting device comprising:
a base board having at least one pair of electrodes configured to be connected to a power supply;
at least one LED chip located adjacent the at least one pair of electrodes of the base board, the LED chip including electrodes electrically connected to the at least one pair of electrodes of the base board;
a silicon resin configured with a soft silicon resin having a tacky surface to encapsulate the at least one LED chip, the silicon resin being disposed above the at least one pair of electrodes of the base board so as to encapsulate the at least one LED chip, and the silicon resin including a surface opposed to the base board; and
microparticles disposed adjacent substantially the entire opposed surface of the silicon resin that does not face the base board and disposed between and in contact with both the silicon resin and an outside atmosphere so as not to expose the silicon resin to the outside atmosphere.

17. The semiconductor light-emitting device according to claim 16, wherein the silicon resin includes at least one of a diffuser, a phosphor material, colored particles using a dye, and a pigment, and wherein the at least one of the phosphor material, colored particles using a dye, and pigment are configured to selectively absorb light having a predetermined wavelength.

18. The semiconductor light-emitting device according to claim 17, wherein the microparticles include $SiO_2$.

19. The semiconductor light-emitting device according to claim 17, wherein the microparticles include at least one of a particle of pigment, a particle of phosphor material, and a colored particle using a dye.

20. The semiconductor light-emitting device according to claim 16, wherein the microparticles include $SiO_2$.

21. The semiconductor light-emitting device according to claim 20, wherein the microparticles include at least one of a particle of pigment, a particle of phosphor material, and a colored particle using a dye.

22. The semiconductor light-emitting device according to claim 16, wherein the microparticles include at least one of a particle of pigment, a particle of phosphor material, and a colored particle using a dye.

23. The semiconductor light-emitting device according to claim 16, wherein the microparticles, base board, and base board electrodes encapsulate the entire silicon resin such that no surface of the silicon resin is exposed to outside atmosphere.

24. The semiconductor light-emitting device according to claim 16, wherein the microparticles are disposed in a dome shape on the silicon resin.

* * * * *